(12) United States Patent
Nguyen

(10) Patent No.: US 6,519,167 B1
(45) Date of Patent: *Feb. 11, 2003

(54) PWM CONTROLLER WITH SINGLE-CYCLE RESPONSE

(76) Inventor: Tranh To Nguyen, 1552 Magnolia Ave., Rohnert Park, CA (US) 94928

( * ) Notice: Subject to any disclaimer, the term of this patent is extended or adjusted under 35 U.S.C. 154(b) by 0 days.

This patent is subject to a terminal disclaimer.

(21) Appl. No.: 10/033,524

(22) Filed: Dec. 27, 2001

Related U.S. Application Data

(63) Continuation of application No. 09/811,312, filed on Mar. 16, 2001, now Pat. No. 6,381,154.

(51) Int. Cl.⁷ .......................... H02M 1/12; H02M 7/44; H02M 7/68
(52) U.S. Cl. .......................... 363/41; 363/97; 323/280
(58) Field of Search .......................... 363/41, 97, 16, 363/40, 131; 323/280, 281

(56) References Cited

U.S. PATENT DOCUMENTS

| | | | | |
|---|---|---|---|---|
| 3,659,184 A | * | 4/1972 | Schwarz | 327/100 |
| 5,278,490 A | * | 1/1994 | Smedley | 323/282 |
| 5,519,361 A | * | 5/1996 | Kim | 332/109 |
| 5,617,306 A | * | 4/1997 | Lai et al. | 323/284 |
| 5,886,586 A | | 3/1999 | Lai | 332/109 |
| 6,084,450 A | * | 7/2000 | Smith et al. | 327/172 |
| 6,249,108 B1 | * | 6/2001 | Smedley et al. | 323/207 |
| 6,381,154 B1 | * | 4/2002 | Nguyen | 323/280 |

* cited by examiner

Primary Examiner—Bao Q. Vu

(57) ABSTRACT

A single-cycle response pulse width modulator comprising a single error integrating amplifier. The error integrator output is compared to zero to set a flip-flop. A linear ramp voltage is compared to the reference voltage to reset the flip-flop. The linear ramp voltage is generated by a voltage-controlled current source coupled to the supply voltage and charging a capacitor. The flip-flop when reset discharges the capacitor. Corrective circuits compensate for delay times in components to maintain substantially constant switching frequency and low distortion in the output voltage. The controller is capable of outputting a predictive triggering signal for associated class-N amplifiers.

20 Claims, 9 Drawing Sheets

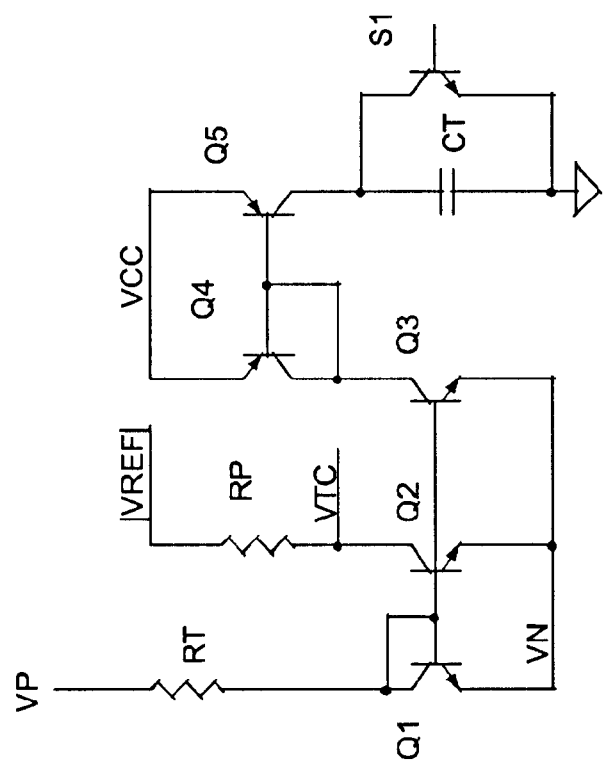
*FIGURE 4C*
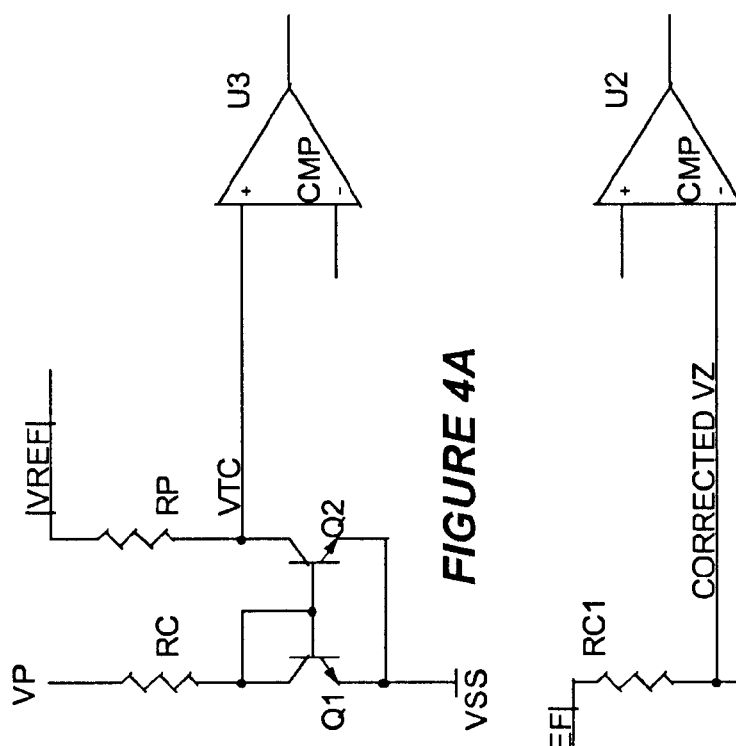
*FIGURE 4A*
*FIGURE 4B*

PWM CONTROLLER WITH SINGLE-CYCLE RESPONSE

This patent application is a continuation of the allowed patent application Ser. No. 09/811,312 filed on Mar. 16, 2001 by the same applicant now U.S. Pat. No. 6,381,154.

BACKGROUND OF THE INVENTION

The present invention relates in general to pulse-width modulators, and more specifically to pulse-width modulators with a single-cycle response using a single integrating amplifier.

Switching converters and switching amplifiers are most often controlled with a pulse-width modulator (PWM). PWM is generally realized by comparing a modulation signal with a sawtooth signal. Linear feedback has traditionally been used to achieve control over certain state variables in the switching converters. However, nonlinear control of PWM switching converters has shown excellent improvement compared to linear feedback methods at optimizing system response, reducing the distortion, and rejecting power supply disturbances. These techniques improve performance over the linearly controlled techniques by directly controlling the switching variables (e.g. switched voltage or current) rather than correcting the error after it has occurred.

U.S. Pat. No. 5,278,490 describes several approaches that ensure the switching variable exactly equals the control reference each switching period and thus have single-cycle response. The constant frequency approach in U.S. Pat No. 5,278,490 is simple, robust, and has been applied to high fidelity class-D audio applications as shown, for example, in U.S. Pat. No. 5,617,306. This technique requires a fast reset circuit and integrator to minimize signal distortion during the reset period. The constant on-time version of U.S. Pat. No. 5,278,490 and the method described in U.S. Pat. No. 3,659,184 are also simple techniques providing single-cycle response by ensuring the error between the switched-variable and the control reference is zero each cycle. A nice feature of these techniques is that they do not need a re-settable integrator, reducing component speed requirements. However, their switching frequency is widely changing (over 10 times), which deteriorates performance.

Switching power amplifiers for high fidelity audio amplification require wide bandwidth and low distortion, which imposes a great challenge to the conventional PWM method. Class-D switching audio amplifiers usually use linear feedback with resulting limited bandwidth due to the need for a stable control loop. Linear feedback methods are susceptible to the power supply ripple, dead time control, and non-ideal switching edges causing distortion. Therefore, to alleviate these problems, the power source is designed to stringent requirements adding cost, complexity, and weight to the system. Since the constant frequency single-cycle response methods ensure that each cycle the average value of the switched-variable equals the control reference, they inherently reject power supply disturbances and non-ideal switching edges, dramatically lowering the power source regulation requirements and easily allowing soft switching to be used. For single-cycle response control methods with widely changing switching frequencies, these advantages are not as prevalent since the frequency modulation effect induces distortion.

U.S. Pat. No. 6,084,450 is another improved nonlinear control technique that has single-cycle response, does not need a fast resettable integrator in the control path, and is suitable for controlling high bandwidth amplifiers with excellent performance. It obtains single-cycle response similar to the non-constant switching methods described in U.S. Pat No. 5,278,490 by forcing the error between the averaged switched-variable and the control reference to zero each cycle. However, the on-pulse or off-pulse of the controller of U.S. Pat. No. 6,084,450 is adjusted each cycle by a circuit comprising a resettable integrator that ensures almost constant switching frequency. Its typical implementations require at least three operational amplifiers using matched resistors and capacitors, at least two bipolar comparators, four different kinds of logic gates and numerous matched resistors and capacitors, and a analog switch to discharge a capacitor. That patent teaches little on the subject of amplifier distortion versus the accuracy of a single-cycle response controller which requires attention in switching behavior of components.

What is needed is a single-cycle controller requiring as few as a single integrating amplifier, unipolar comparators, and few matching components for good manufacturability, higher reproducibility, and lower cost.

SUMMARY OF THE INVENTION

The present invention pertains generally to a nonlinear controller that has single-cycle response, and is suitable for controlling high bandwidth amplifiers with excellent performance. It obtains single-cycle response similar to prior art methods described in U.S. Pat. Nos. 5,278,490 and 6,084,450 by forcing the error between the averaged switched variable and the control reference to zero each cycle. However, unlike prior art methods, the present invention does not need any resettable integrator, requires a single integrating amplifier, and fewer components. It also provides a method and apparatus to compensate for delay times of comparators and switching circuits to achieve low distortion in the output of the amplifiers, and pre-trigger signal for the power modulator of the amplifiers.

In accordance with an aspect of the invention, a PWM control method is provided for controlling a switched variable such that the average of the switched variable in one cycle is equal or proportional to a reference voltage cycle. Control of the cycle average can be achieved by integrating the error between the switched variable and the reference signal, wherein the switched variable will be forced to change its state when the error reaches zero. In addition, the width of the pulses is adjusted by a simple technique to achieve near constant switching frequency.

In accordance with another aspect of the invention a PWM controller for controlling a switched variable with single-cycle response is provided which comprises an error integrator circuit, comparator circuits and a flip-flop. It is capable of controlling either a binary variable, a tri-state variable, or a multi-state variable. When the integrated error reaches zero, at least one of the comparators will change state thus trigger the switch to change its state. The state of the switch is changed again when the same integrated error signal is equal to a threshold derived from the reference voltage.

BRIEF DESCRIPTION OF THE DRAWINGS

The invention will be more fully understood by reference to the following drawings which are for illustrative purposes only:

FIG. 4A is a schematic illustrating a compensating circuit for the threshold comparator.

FIG. 4B is a schematic illustrating a compensating circuit for the zero crossing detector.

FIG. 4C is a schematic illustrating a combination of compensating circuit for the threshold comparator and ramp generator in a typical integrated circuit implementation.

DESCRIPTION OF THE INVENTION

Figure 1:
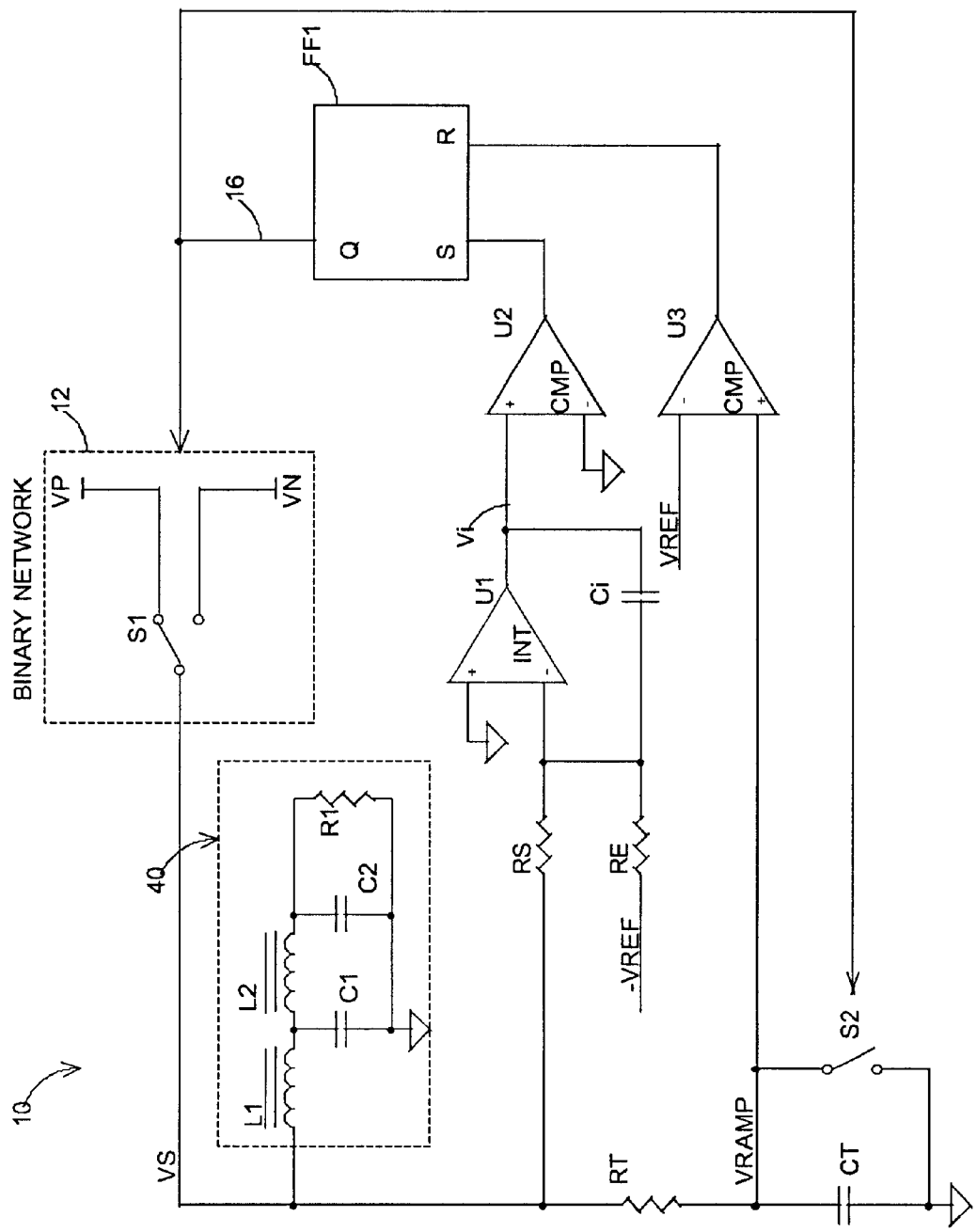
FIG. 1 is a functional block diagram of a first embodiment of a PWM controller with single-cycle response in accordance with the present invention.
Figure 2:
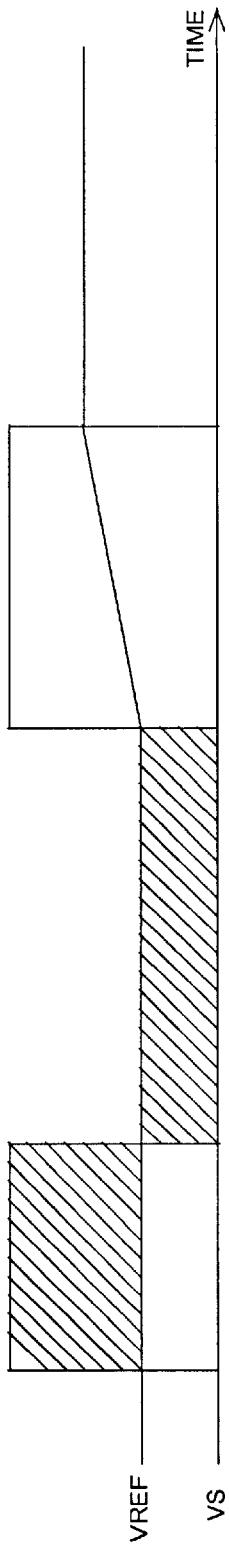
FIG. 2 is a timing diagram for the PWM controller shown in FIG. 1.
Figure 2:
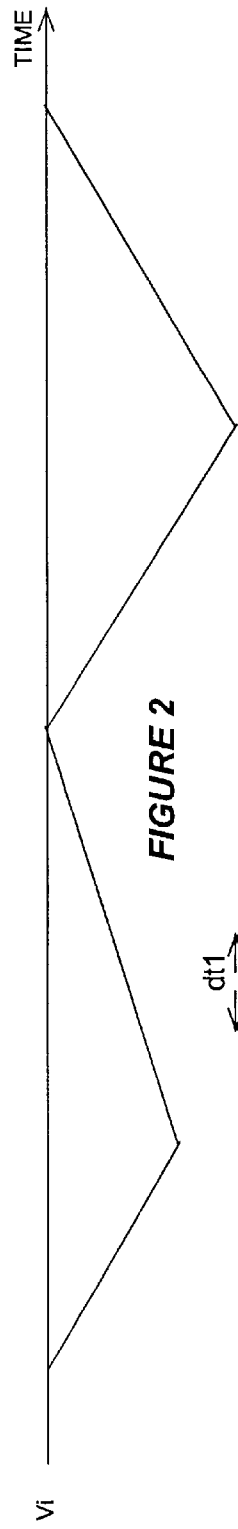

The control method and apparatus 10 of the present invention can be seen with reference to the functional block diagram shown in FIG. 1 and the waveforms shown in FIG. 2. The switched network 12 represents any system where a switched variable Vs is to be controlled. For example, the switched variable of a buck converter can be the diode voltage which is controlled by turning on or off the main switch. In FIG. 1 the block 40 represents a load R1 with its LC filter L1-C1-L2-C2. The single-cycle response of the system is ensured by forcing the local average (average over one switching cycle) of the switched variable Vs, to exactly equal Vref each switching cycle. The width of the on-pulse 16 is adjusted each cycle to achieve constant switching frequency by comparing a ramp voltage to the reference voltage Vref to obtain a reset signal for the switch S1. The switch S1 then changes its state again when the integrated error voltage Vi of the error integrator U1 equals zero at $t_2$ and the next cycle is started. Note in FIG. 2 that the cross-hatched areas are equal, showing that the local average Vs exactly equals Vref at the end of the switching cycle and a single-cycle response results. The switching frequency is held approximately constant by the choice of the moment $t_1$ the comparator 22 therefore the switched variable Vs change state. The first embodiment as shown in FIG. 1 is suitable for controlling a binary variable, or any switching system that can be reduced to a binary variable, such as a H-bridge, where its two switched voltages are simply opposite of each other and a difference amplifier can reduce them to a binary variable. It uses only two comparators U2 and U3—a zero crossing detector is usually implemented with a comparator with one input tied to zero voltage, three resistors RS, RE, and RT, and two capacitors Ci and CT, in addition to the single operational amplifier U1, a flip-flop FF1, and an auxiliary discharging switch S2.

To establish conditions for near constant switching frequency, it is sufficient to write the equation establishing the condition of zero integrated error at the end of a cycle:

$$\int_0^{t_1}(VP - Vref)*dt + \int_{t_1}^{Ts}(VN - Vref)*dt = 0 \qquad (Eq.\ 1)$$

Assuming VP and Vref are constant during the switching period, (1) becomes $$Vp*t_1 + VN*(Ts - t_1) = Vref*Ts \ldots (Eq.2)$$

Rearranging (2) gives $$t_1 = \frac{Vref - VN}{VP - VN}Ts \qquad (Eq.\ 3)$$

If VN is zero, such as in most practical cases, (Eq.3) is simplified to $$t_1 = \frac{Vref}{VP}Ts \qquad (Eq.\ 4)$$

Figure 6:
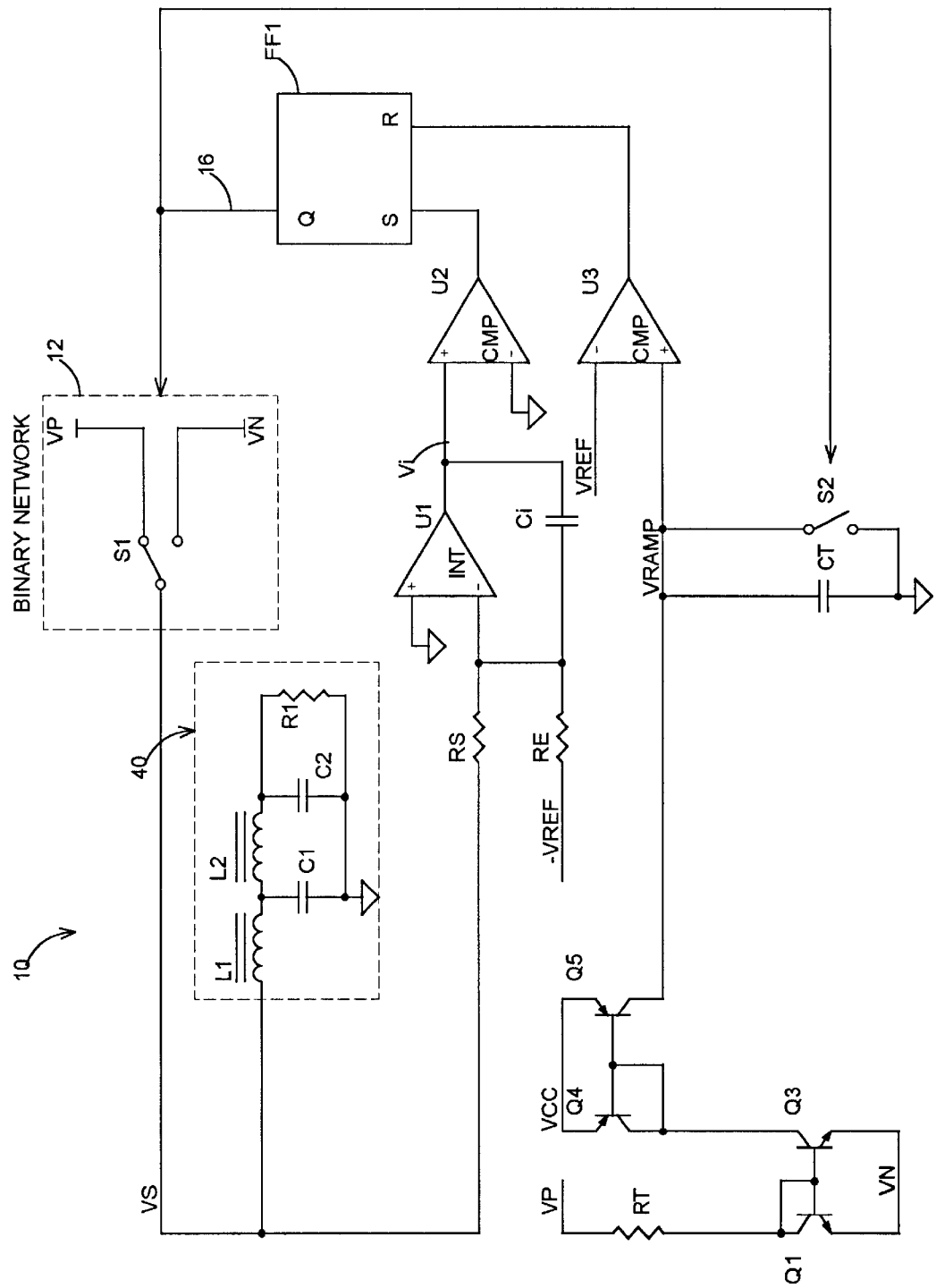
FIGS. 6, 7, 8 are block diagrams of the alternate embodiments of FIGS. 1, 3, 4 with a linear ramp generator.
Figure 7:
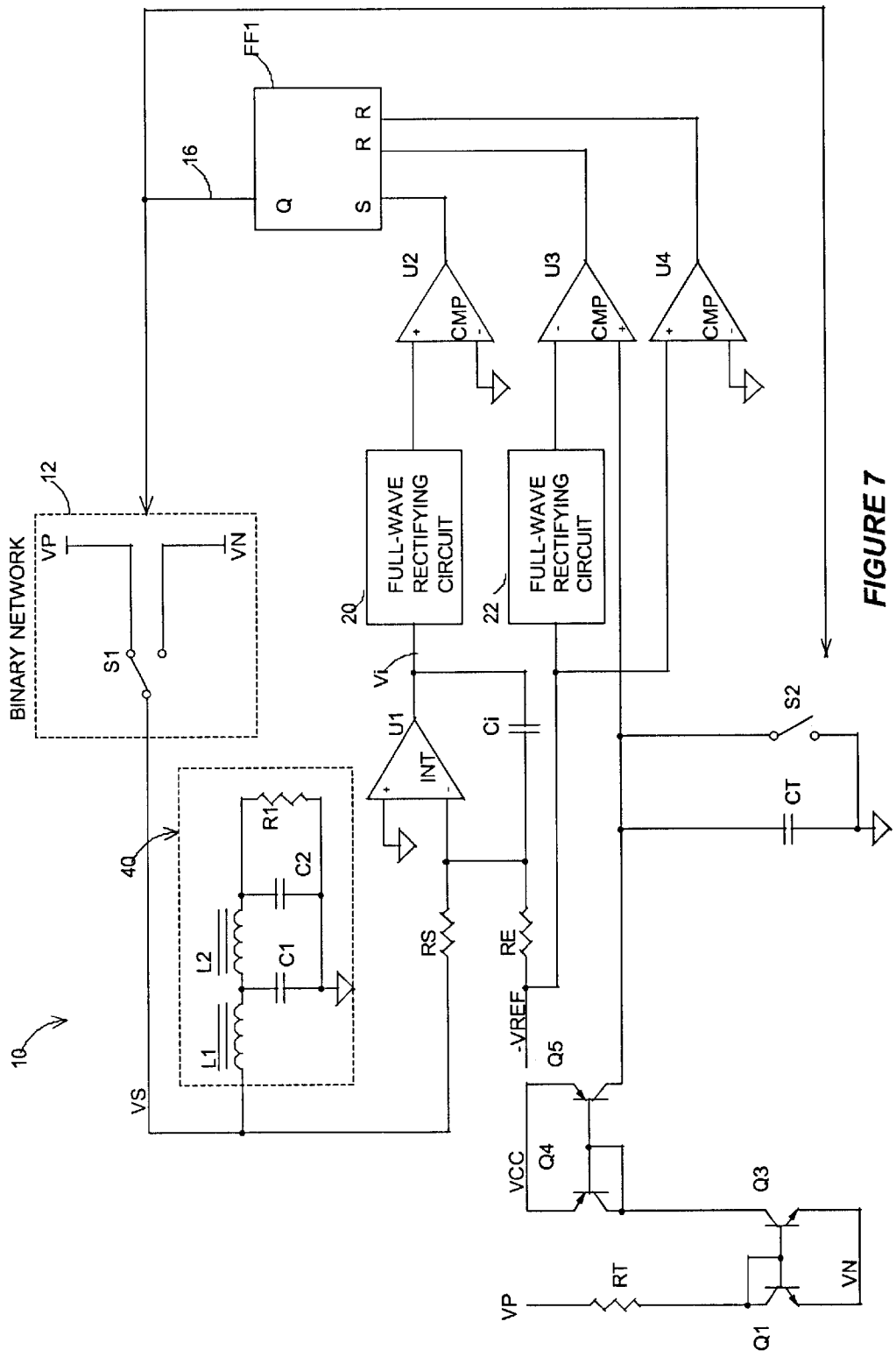
Figure 8:
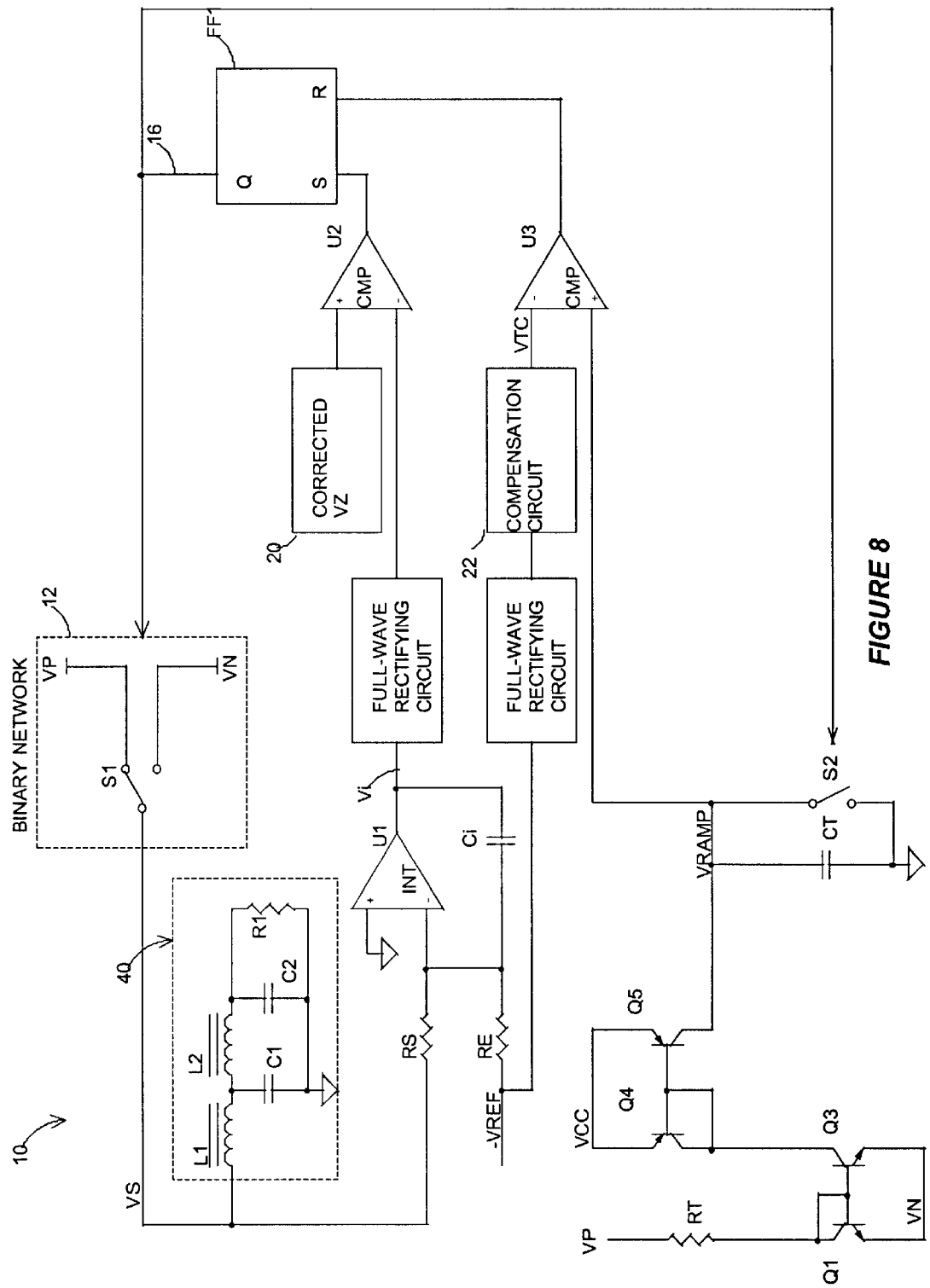

A simple ramp with a slope proportional to VP compared to Vref will provide ON period that will result in practically constant switching frequency of the PWM. This kind of ramp is found in many PWM ICs such as UC1823, UC1825 where supply voltage feed-forward can be implemented to compensate for the variation of the supply voltage, by charging a capacitor CT through a resistor RT connected to the supply voltage or to the switch variable VS when it is turned on, FIGS. 1, 3, 4. For a more linear ramp VRAMP, a current mirror circuit comprising of four transistors Q1-Q3-Q4-Q5 is often used in an integrated circuit implementation of the PWM controller, FIGS. 6, 7, 8, which offers the added advantage of inherent voltage limiting on the ramp voltage VRAMP which is normally fed to a comparator U3, a current scaling factor that can further reduce the size of the capacitor CT, and voltage level translation so that an unregulated negative supply voltage VN can be accommodated as per Eq. 3.

Figure 3:
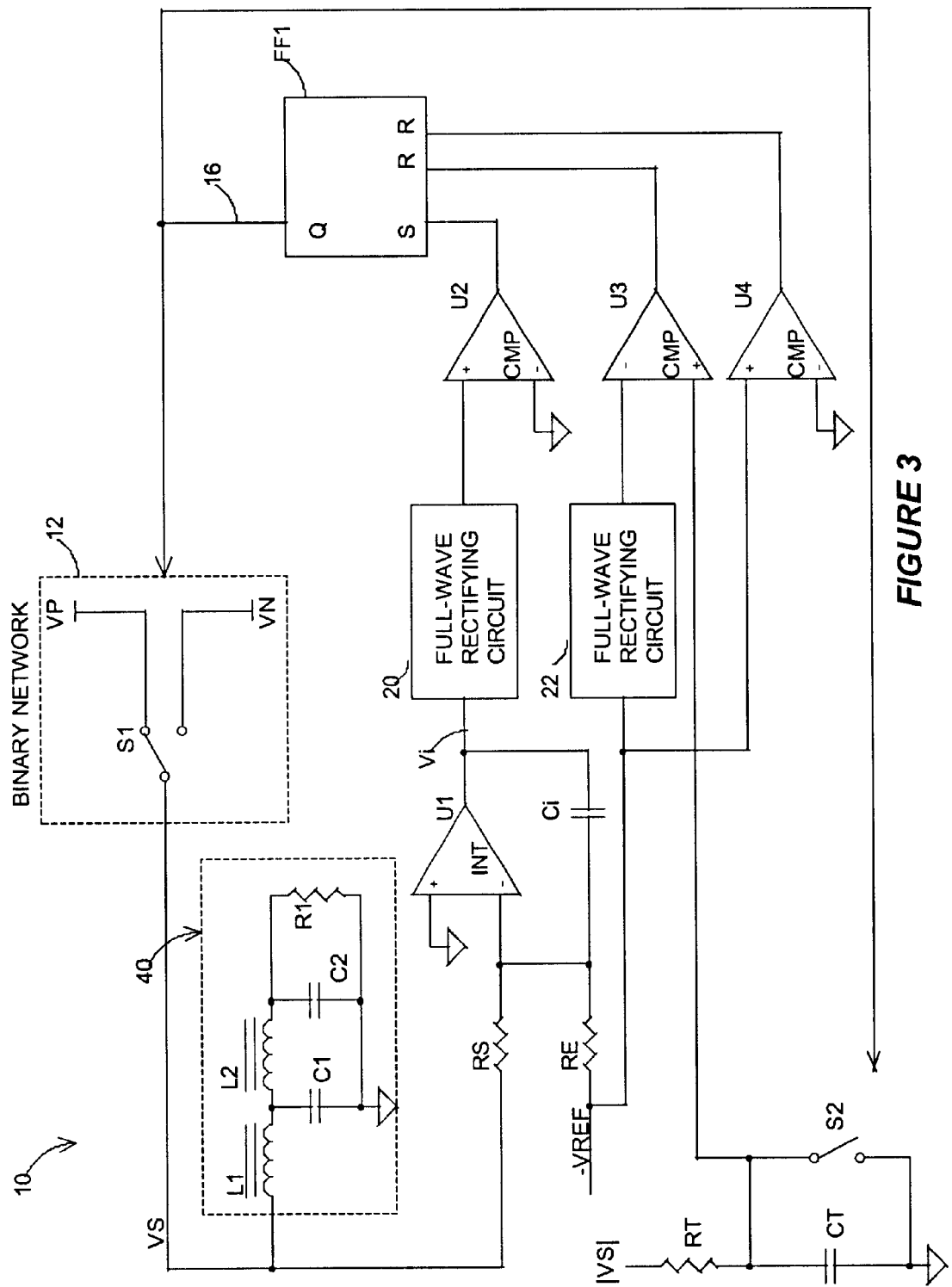
FIG. 3 is a functional block diagram of an improvement of the first embodiment of a PWM controller with single-cycle response in accordance with the present invention
Figure 4:
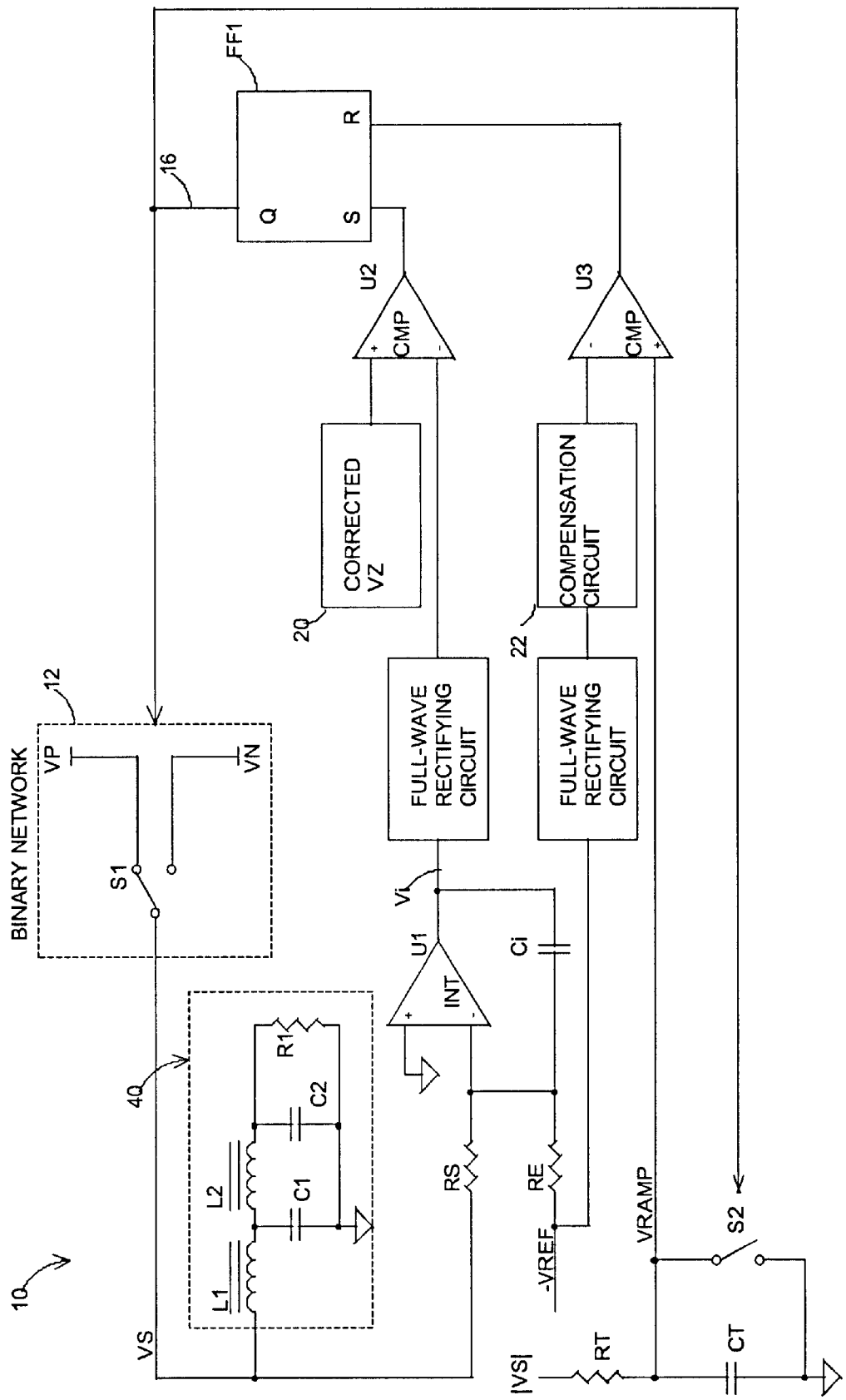
FIG. 4 is a functional block diagram of another improvement of the first embodiment of a PWM controller with single-cycle response in accordance with the present invention.

When the reference voltage Vref is an audio signal therefore bipolar, some refinements of the basic circuit of the first embodiment is necessary. FIG. 3 depicts the added circuits, namely two full-wave rectifying circuits 20 and 22 operating on the integrated error voltage Vi of the error integrator U1 and the reference voltage Vref, and another zero crossing detector U4 to detect the moment the reference voltage Vref crosses zero to set the flip-flop FF1. Indeed, it occurs that when the reference voltage Vref crosses zero after the switched variable VS is turned on, the integrated error voltage Vi of the error integrator U1 will not go back to zero again because both the switched variable Vs and the reference voltage Vref now act in the same direction at the error integrator U1. The full-wave rectifying circuit 20 provides the magnitude of the integrated error voltage Vi so that the same comparator U2 can be used. If the full-wave rectifying circuit 20 is not used, a negative voltage comparator and a logic gate would be needed to provide the same result of magnitude comparison with more components and the difficulty of dealing with bipolar signals. Similarly the second full-wave rectifying circuit 22 allows the same comparator U3 to compare the ramp voltage VRAMP with the magnitude of the reference voltage Vref In the real world, there are always delays between the input and the output signals of an electronic device such as a comparator or a logic gate. A delay dt1, FIG. 5, in the comparator U3 will require a corrective term dVref in the reference voltage Vref that can be determined by taking the differential of (Eq. 4) and by making dTs=0 to keep the switching period constant:

$$dt1 = dVref \frac{Ts}{VP} + dTs \frac{Vref}{VP} \quad \text{(Eq. 5)}$$

$$dVref = -dt1 \frac{VP}{Ts} \quad \text{(Eq. 6)}$$

Thus a corrective term proportional to VP can be subtracted from Vref to produce the corrected threshold voltage VTC for the comparator U3. A compensation circuit 26 providing that corrected threshold voltage VTC is shown in FIG. 4A, where the voltage drop across the resistor RP is proportional to the supply voltage VP due to the current mirror comprising the transistors Q1-Q2 and the resistor RC connected to VP. With proper current scaling, the current mirror comprising Q1-Q2 can be merged into the current mirror for the generation of the ramp voltage VRAMP comprising four transistors Q1-Q3-Q4-Q5 of FIGS. 6, 7, 8 for a very compact integrated circuit, FIG. 4C.

Figure 5:
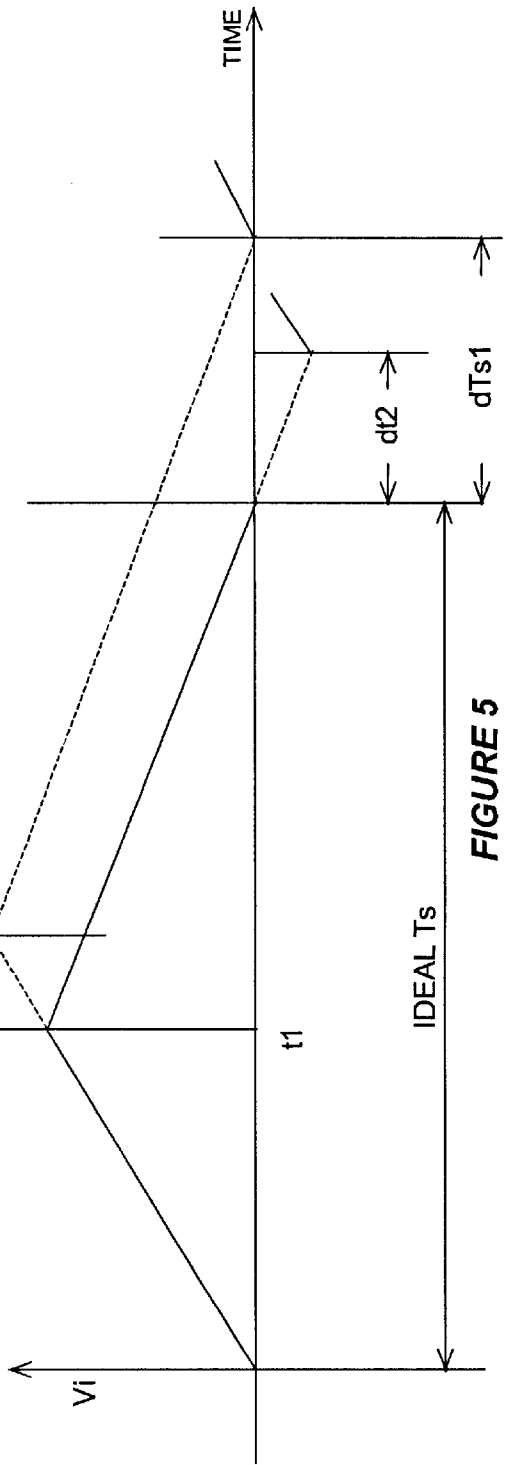
FIG. 5 is a timing diagram illustrating the effects of delays in the switching period of the controller.

Similarly, a delay dt2, FIG. 5, between the moment the integrated error voltage Vi crosses zero and the switch S1 being turned on will result in not only an incremental switching period dTs2=dt2, but more importantly also an error in the output voltage which is the value of the switched variable Vs averaged over the switching period Ts. A corrected voltage VZ that allows the zero crossing detector U2 to put out a predictive triggering signal is proportional to the delay dt2 and to the height of the ramp integrating the error voltage VP−Vref, and inversely proportional to the OFF period Ts−t1 of the switched variable:

$$VZ = \frac{dt2}{ReCi \cdot (Ts - t1)} \int_0^{t1} (VP - Vref) * dt = Vref \cdot \frac{dt2}{ReCi} \quad \text{(Eq. 7)}$$

Figure 9:
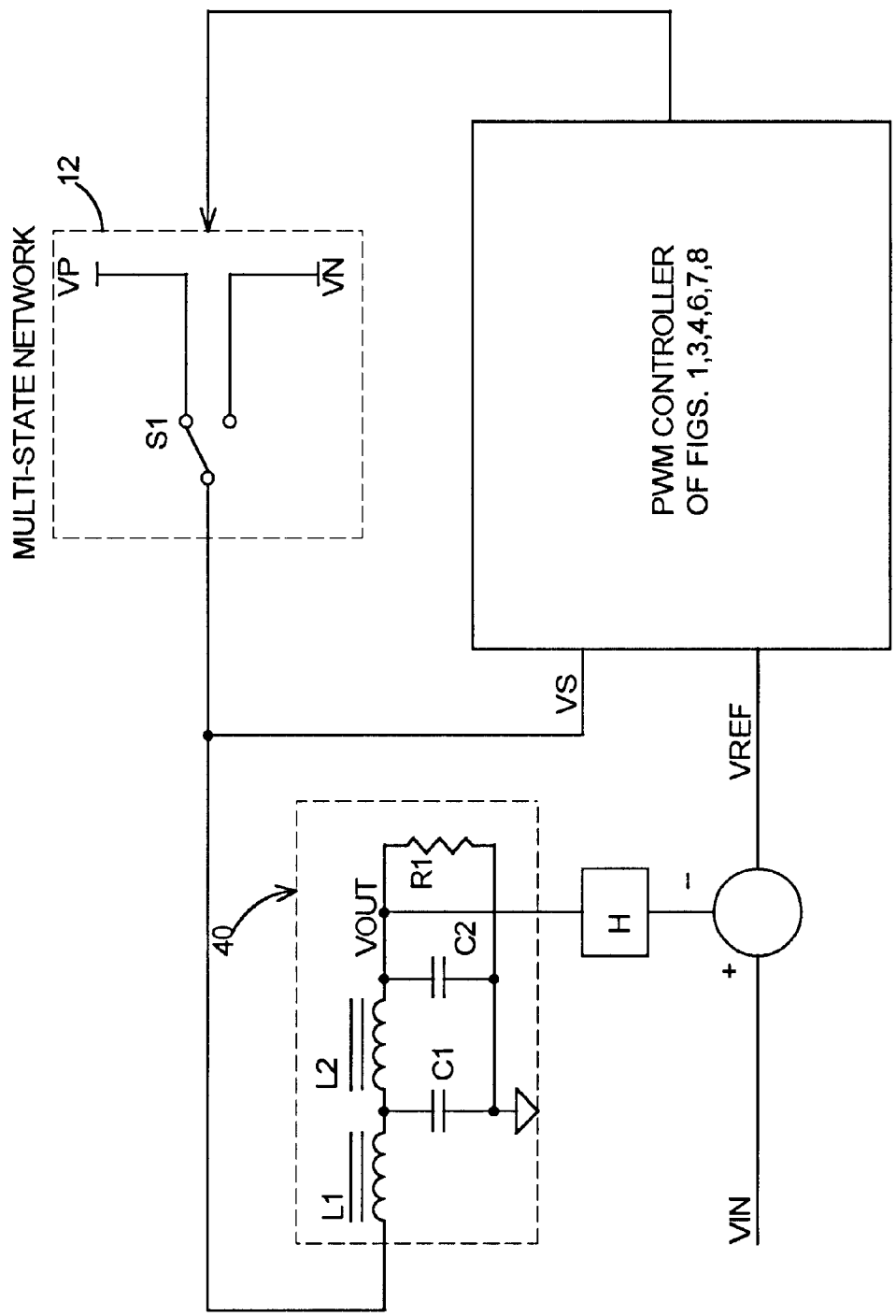
FIG. 9 is a block diagram illustrating combination of single-cycle control with conventional feedback.

A circuit 24 supplying a corrected voltage VZ proportional to Vref and to dt2 is all it takes to compensate for the delay dt2. FIG. 4B shows a voltage divider circuit comprising two resistors RC1-RC2 connected in series and connected to Vref, to generate VZ to compensate for the delay dt2. With an accurate triggering time for setting the flip-flop FF1, the single-cycle response control will minimize the distortion of a switching amplifier. The ratio of a delay dt2 in the setting of the flip-flop to the switching period Ts is proportional to the distortion ratio of the output of a switching amplifier using a single-cycle response controller. Therefore an effective delay dt2e remaining after the correction by predictive triggering of the flip-flop FF1 should be minimized. Distortion is a key parameter in comparing performance of amplifiers, in spites of the fact that human ears can barely distinguish a distortion factor below 1%. The same correction mechanism as for the delay dt2 can also be used to create a predictive trigger signal for the power modulator of a class-N amplifier which is subject of a co-pending patent application of the same applicant, to achieve its zero current switching and/or minimum overall distortion FIG. 9 illustrates a combination of single-cycle control with conventional feedback to further improve the output VOUT of the system, by summing with correct polarity the input signal VIN with a derived signal from the output voltage VOUT through a transmittance H to obtain the signal Vref which is integrated by the error integrating amplifier U1 of previous embodiments.

SUMMARY, RAMIFICATION AND SCOPE

Accordingly the reader can see that the invented single-cycle response PWM controller is very simple, manufacturable, and low cost, yet capable of very high accuracy. It can be used to control a switch-mode power converter or a switching amplifier, in particular a class-N amplifier operating in ternary mode. Due to its simple structure, an integrated circuit can easily be made from the described embodiments and circuits.

In the description of the preferred embodiments, a reference voltage is used as an input to the PWM controller. However, that reference voltage can be the output voltage of a conventional error amplifier of a servomechanism. Such a combination of single-cycle response control with linear feedback control will result in an even higher accuracy of the output variable and a high bandwidth for a system incorporating both control techniques, because less feedback is required.

While the preferred embodiments of the present invention have been shown and described herein, it will be obvious that such embodiments are provided by way of example only. Numerous variations, changes, and substitutions will occur to those skilled in the art without departing from the spirit and scope of the invention herein. Therefore it must be understood that the illustrated embodiments have been set forth for the purposes of examples and it should not be taken as limiting the invention as defined by the following claims.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

In addition to the equivalents of the claimed elements, obvious substitutions now or later known to one with ordinary skill in the art are defined to be within the scope of the defined elements. Thus the scope of the invention should be determined by the appended claims and their legal equivalents, rather than by the examples given.

I claim:

1. A single-cycle response PWM controller receiving a reference voltage and putting out a PWM signal to control a switched variable operating from a supply voltage, the PWM controller comprising:

an error integrating amplifier for integrating the difference between the reference voltage and the switched variable and for putting out an integrated error voltage, a zero crossing detector for determining the moment the integrated error voltage crosses zero, a comparator for comparing a linear ramp voltage to the reference voltage, a flip-flop for putting out a PWM signal, the flip-flop being selectively set by the zero crossing detector and selectively reset by the comparator, and a voltage-controlled current source coupled to the switched variable for charging a capacitor with a current proportional to the switched variable to generate the linear ramp voltage and for discharging the capacitor when the switched variable is turned off such that the frequency of the PWM signal is substantially constant.

2. The PWM controller of claim 1 wherein the zero crossing detector compares the integrated error voltage to a voltage proportional to the reference voltage.

3. The PWM controller of claim 1 wherein the comparator compares the ramp voltage to the reference voltage corrected with a voltage proportional to the supply voltage.

4. The PWM controller of claim 3 wherein the voltage proportional to the supply voltage is supplied by a current mirror connected to the supply voltage.

5. A single-cycle response PWM controller receiving a bipolar reference voltage and putting out a PWM signal to control a switched variable, the switched variable operating from a supply voltage, the PWM controller comprising:

an error integrating amplifier for integrating the difference between the reference voltage and the switched variable and for putting out an integrated error voltage, a first full-wave rectifying circuit for obtaining the magnitude of the integrated error voltage, a second full-wave rectifying circuit for obtaining the magnitude of the reference voltage, a first comparator for determining the moment the magnitude of the integrated error voltage becomes zero, a second comparator for comparing a linear ramp voltage to the magnitude of the reference voltage, a flip-flop for putting out a PWM signal, the flip-flop being selectively set by the first comparator and selectively reset by the second comparator, and a voltage-controlled current source for charging a capacitor with a current proportional to the switched variable to generate the linear ramp voltage and for discharging the capacitor when the switched variable is turned off such that the frequency of the PWM signal is substantially constant.

6. The PWM controller of claim 5 wherein the linear ramp voltage is generated by charging a capacitor with the supply voltage via a current mirror circuit.

7. The PWM controller of claim 5 wherein the flip-flop is also set when the reference voltage crosses zero.

8. The PWM controller of claim 5 wherein a predictive trigger signal is obtained by comparing the integrated error signal to a voltage proportional to the reference voltage.

9. The PWM controller of claim S wherein the second comparator compares the linear ramp voltage to the magnitude of the reference voltage corrected by a voltage proportional to the supply voltage.

10. The PWM controller of claim 9 wherein the voltage proportional to the supply voltage is supplied by a current mirror connected to the supply voltage.

11. A single-cycle response PWM controller operating at substantially constant frequency, receiving an audio reference voltage and putting out a PWM signal to control a switched variable operating from a supply voltage, the PWM controller comprising:

an error integrating amplifier for integrating the difference between the audio reference voltage and the switched variable and for puffing out an integrated error voltage, a first zero crossing detector for determining the moment the integrated error voltage crosses zero, a second zero crossing detector for determining the moment the audio reference voltage crosses zero, a voltage-controlled current source for charging a capacitor with a current proportional to the switched variable to generate a linear ramp voltage and for discharging the capacitor when the switched variable is turned off, a comparator for comparing the linear ramp voltage to the magnitude of the audio reference voltage, a flip-flop for putting out a PWM signal, the flip-flop being selectively set by the first zero crossing detector and selectively reset by the comparator, and selectively set by the second zero crossing detector, wherein the feed-forward mechanism of the linear ramp voltage maintains the frequency of the PWM signal substantially constant.

12. The PWM controller of claim 11 wherein the comparator compares the linear ramp to the magnitude of the reference voltage corrected by a voltage proportional to the supply voltage.

13. The PWM controller of claim 12 wherein the voltage proportional to the supply voltage is supplied by a current mirror connected to the supply voltage.

14. The PWM controller of claim 11 wherein a predictive trigger signal is obtained by comparing the integrated error voltage to a voltage proportional to the reference voltage.

15. The PWM controller of claim 14 wherein the predictive trigger signal selectively sets the flip-flop to turn on the switched variable when the integrated error voltage crosses zero.

16. The PWM controller of claim 11 wherein the audio reference voltage is a combination of an input signal and a feedback signal derived from an output of a system controlled by the PWM controller.

17. The PWM controller of claim 1 wherein the reference voltage is a combination of an input signal and a feedback signal derived from an output of a system controlled by the PWM controller.

18. The PWM controller of claim 5 wherein the bipolar reference voltage is a combination of an input signal and a feedback signal derived from an output of a system controlled by the PWM controller.

19. A method for maintaining substantially constant the frequency of a PWM controller with single-cycle response having an error integrating amplifier, a zero crossing detector for determining the moment the integrated error voltage crosses zero to set a flip-flop, a comparator for comparing a linear ramp voltage to the magnitude of a reference voltage to reset the flip-flop, the flip-flop controlling a switched variable operating from a supply voltage, the method comprising the steps of generating the linear ramp voltage by charging a capacitor via a voltage-controlled current source coupled to the supply voltage when the switched variable is turned on by the flip-flop until the comparator turns off the flip-flop, correcting the reference voltage by a voltage proportional to the supply voltage prior to comparing it to the linear ramp voltage, and correcting the zero crossing detector threshold with a voltage proportional to the reference voltage.

20. The method of claim 19 wherein the correcting voltage proportional to the supply voltage comes from a current mirror coupled to the supply voltage.

* * * * *